(12) United States Patent
Juo et al.

(10) Patent No.: US 10,057,984 B1
(45) Date of Patent: Aug. 21, 2018

(54) COMPOSITE THIN COPPER FOIL AND CARRIER

(71) Applicant: Chang Chun Petrochemical Co., Ltd., Taipei (TW)

(72) Inventors: Tsang-Jin Juo, Taipei (TW); Kuei-Sen Cheng, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 15/422,960

(22) Filed: Feb. 2, 2017

(51) Int. Cl.
| | |
|---|---|
| H05K 1/03 | (2006.01) |
| H05K 1/09 | (2006.01) |
| H05K 3/00 | (2006.01) |
| H05K 3/18 | (2006.01) |
| H05K 3/28 | (2006.01) |
| C25D 3/38 | (2006.01) |
| C25D 5/48 | (2006.01) |
| C25D 7/00 | (2006.01) |

(52) U.S. Cl.
CPC ............ *H05K 1/09* (2013.01); *C25D 3/38* (2013.01); *C25D 5/48* (2013.01); *C25D 7/00* (2013.01); *H05K 3/007* (2013.01); *H05K 3/188* (2013.01); *H05K 3/28* (2013.01); *H05K 2201/05* (2013.01); *H05K 2203/0143* (2013.01); *H05K 2203/1545* (2013.01)

(58) Field of Classification Search
None
See application file for complete search history.

(56) References Cited

U.S. PATENT DOCUMENTS

| | | | | |
|---|---|---|---|---|
| 3,998,601 A | * | 12/1976 | Yates | H05K 3/025 428/612 |
| 5,114,543 A | | 5/1992 | Kajiwara et al. | |
| 5,262,247 A | | 11/1993 | Kajiwara et al. | |
| 5,700,362 A | * | 12/1997 | Yano | C23C 22/68 205/191 |
| 6,319,620 B1 | | 11/2001 | Kataoka et al. | |
| 6,322,904 B1 | * | 11/2001 | Dobashi | C23C 28/00 428/624 |
| 6,660,406 B2 | * | 12/2003 | Yamamoto | H05K 3/20 428/615 |
| 6,777,108 B1 | * | 8/2004 | Obata | C25D 1/04 428/607 |
| 6,902,824 B2 | * | 6/2005 | Yamamoto | H05K 3/025 428/615 |

(Continued)

OTHER PUBLICATIONS

Matjaz Finsgar & Ingrid Milosev, Inhibition of Copper Corrosion by 1,2,3-benzotriazole: A Review, 52 Corrosion Science 2737 (2010).*

*Primary Examiner* — David Sample
*Assistant Examiner* — Nicholas W. Jordan
(74) *Attorney, Agent, or Firm* — Nixon Peabody LLP; Thomas P. Pavelko

(57) ABSTRACT

A method and production of composite foils and thin copper foils peeled from said composite copper foils is disclosed for use in forming printed circuit boards (PCB). Either the composite foil or only the thin copper foil can be laminated to a polymer layer to form the printed circuit board, with the step of separating the thin copper foil from the composite copper foil is performed subsequent to said laminating step.

17 Claims, 6 Drawing Sheets

(56) References Cited

U.S. PATENT DOCUMENTS

| | | | |
|---|---|---|---|
| 7,731,831 B2 * | 6/2010 | Brenneman | C23C 26/00 205/227 |
| 8,866,018 B2 * | 10/2014 | Pramanik | H01G 4/18 174/117 FF |
| 2002/0160219 A1 | 10/2002 | Brenneman et al. | |
| 2005/0089709 A1 * | 4/2005 | Brenneman | C23C 26/00 428/615 |
| 2012/0111613 A1 * | 5/2012 | Oguro | C23C 30/00 428/551 |
| 2013/0220679 A1 * | 8/2013 | Kawakami | C25D 1/04 428/615 |
| 2017/0042044 A1 * | 2/2017 | Miyamoto | H05K 3/025 |

* cited by examiner

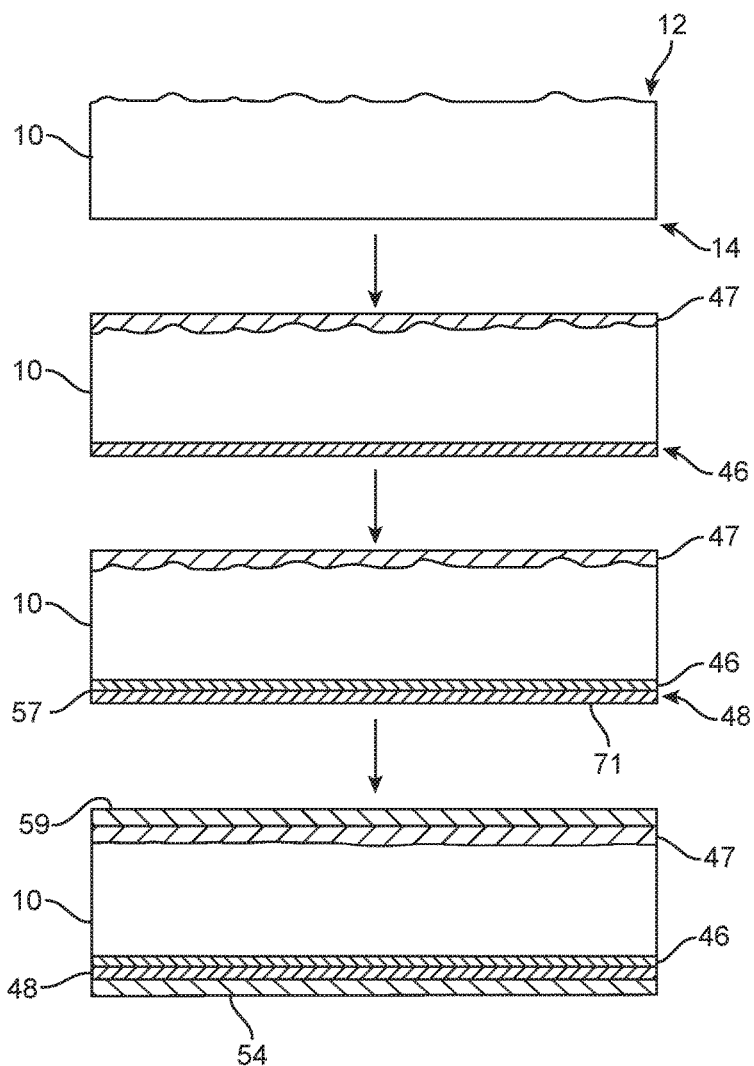

COMPOSITE THIN COPPER FOIL AND CARRIER

FIELD OF THE DISCLOSURE

The present disclosure relates to a composite foil structure including a structural carrier layer, which can be a thick carrier layer having a first side and an second side and one release layer is provided in contact with at least one of the first side and the second side. A thin electrodeposited copper foil having a first side and a second side, with one of the first or second sides in contact with the release layer is provided. One nodular layer and anti-tarnish layer may optionally be deposited on at least one of the first or second sides of the carrier layer, the side of the thick carrier layer opposite the release layer and optionally on the second side of the thin electrodeposited copper foil. The composite foil is provided with an organic layer on the anti-tarnish layer(s) if present, or on nodular layer(s) if present, or directly on one of the first or second sides of the carrier layer. Methods of producing the composite foil, separating a thin copper foil from the composite foil and manufacturing printed circuit boards (PCB) with the composite and thin foils and resultant PCBs are disclosed.

BACKGROUND

Flexible printed circuit board (FPCB) are generally known to contain a flexible copper-clad laminate ("FCCL"), which is produced by forming a resin layer as an insulating resin layer on a copper foil. In the flexible copper-clad laminate having thin copper foil, polyimide has been used as a resin, pressed under pressure to the thin copper foil. A laminate of thin copper foil and a polyimide layer can be manufactured by a roll-to-roll process such that polyimide is placed on a thin copper foil with a carrier layer, in which the carrier layer is facing to the hot pressing roller. When the thin copper foil laminated to polyimide and consolidated at elevated conditions of temperature and pressure, the high temperature (350° C.) will cause the carrier layer of flexible copper-clad laminate to partially stick to the hot pressing roller. During hot pressing, if part of the carrier layer is stuck to the hot pressing roller, as hot pressing is a continuous process, a flexible copper clad laminate will be fed and wound continuously, thereby creating a pulling force between the hot pressing roller and the carrier layer. Therefore, the bonding strength of the carrier layer and thin copper foil by rolling becomes poor and non-uniform, and then wrinkles and blisters can happen on the interface between the carrier layer and the thin copper foil. Sometimes it causes the carrier layer to partial peel off from the thin copper foil before using the composite to manufacture flexible printed circuit board. These and other drawbacks, inefficiencies, high cost of raw materials, inability and/or difficulty to produce greater number of circuits per unit volume and reduction in defective PCBs produced are avoided by following the various embodiments set forth below.

SUMMARY OF THE DISCLOSURE

By using benzotriazole ("BTA") as an anti-stick agent ("the first organic layer") on a carrier layer before laminating a thin copper foil onto the insulating resin layer, the drawbacks of the carrier layer sticking to the hot pressing roller of the roller press are avoided.

According to one embodiment of the invention, the anti-stick agent ("the first organic layer" is "always near" the carrier layer. Suitable BTA include benzotraiazole and substituted triazoles, their derivatives and combinations. Examples of substituted triazoles include 1,2,3-benzotriazole, carboxybenzotriazole, 1H-1,2,4-triazole, and aminotriazole, orthotriazole (1,2,3-tolyltriazole).

In a second embodiment, a silane coupling agent (a "second organic layer" is near the thin copper foil. Silane coupling agents suitable as the second organic layer are represented by the following formula: $Y-R'-Si(OR)_3$, wherein Y is selected from the group consisting of glycidoxy (epoxy), amino, epoxycyclohexyl, uramino, carbamate, malonate, carboxy, cyano, acetoxy, acryloxy, methacryloxy, chloromethylphenyl, pyridyl, vinyl, dialkylamino, phenylalkylamino, and imidazole; R' is ethylene, propylene, or phenylene substituted by ethyl or propyl, wherein the phenyl ring is attached to Y, or a bond; R is methyl, ethyl or other linear or branched $C_3$-$C_6$ alkyl.

In a third embodiment, an optional nodular layer can be provided.

In still other embodiments, a release layer can be present. The release layer often formed with metal (such as chromium, nickel, cobalt or molybdenum), metal oxide (such as chromium oxide, nickel oxide, chromium phosphate or nickel phosphate) or organic compounds (such as benzotriazole, benzotriazole derivative and combinations thereof) on the carrier layer. The release layer provides sufficient adhesion to prevent premature separation of the thin copper foil from the carrier layer, but easy removal of the carrier layer when desired.

When the composite foil has only one release layer, a thin electrodeposited copper foil having first and second sides and the thin electrodeposited copper foil thickness being less than the carrier layer thickness, wherein the structural carrier layer first side is in contact with the release layer first side, the release layer second side is in contact with the thin electrodeposited copper foil first side, a first nodular layer having opposed first and second sides is present or absent, an anti-tarnish layer having opposed first and second sides is present or absent, a first organic layer over the second side of the carrier layer, the first organic layer being an outermost layer of the composite foil, wherein if the first nodular layer is absent, the first organic layer is in contact with the carrier layer second side or anti-tarnish layer, wherein if the first nodular layer is present, the first nodular layer first side is in contact with the carrier layer second side and the first nodular layer second side is in contact with the first organic layer or anti-tarnish layer, and a second nodular layer may be present or absent, wherein if the second nodular layer is present, the second nodular layer contacts the thin electrodeposited copper foil second side or anti-tarnish layer. In a particularly preferred embodiment of the invention, a composite foil having a structural carrier layer, where the carrier layer can be chosen from a thick metal foil, preferably a thick copper foil, the thick copper foil sometimes being an electrodeposited copper foil having a drum side and a deposited side. A typical device for manufacturing an electrodeposited copper foil comprises a metal cathode drum and an insoluble metal anode, the metal cathode drum being rotatable and having a mirror polished surface. The insoluble metal anode is arranged at approximately the lower half of the metal cathode drum and surrounds the metal cathode drum. An electrodeposited copper foil is continuously manufactured with the device by flowing a copper-containing electrolytic solution between the cathode drum and the anode, applying an electrical current between these to allow copper to be electrodeposited on the cathode drum, and detaching an electrodeposited copper foil from the cathode drum when a predetermined thickness is obtained. The electrodeposited copper foil so produced has a drum side (the surface of the electrodeposited copper foil formed on the cathode drum) and a deposited side (the surface of the electrodeposited copper foil in contact with the copper-containing electrolytic solution) which is on the surface of the electrodeposited copper foil opposite the drum side.

At least one of the drum side and deposited side of the thick copper foil is in contact with a release layer. The release layer is in contact with a thin electrodeposited copper foil, the thin electrodeposited copper foil having a deposited side (the surface of the thin electrodeposited copper foil in contact with the copper-containing electrolytic solution), and a shiny side, the shiny side being adjacent the release layer. One nodular layer may optionally be deposited on at least one of the sides selected from the group consisting of the deposited side, the side of the thick copper foil opposite the release layer and optionally on the deposited side of the thin electrodeposited copper foil; and, finally an anti-tarnish layer and then organic layer being laid over the nodular layer on the deposited side of the thick copper foil.

In particularly preferred embodiments, the organic layer is one selected from the group consisting of benzotriazole (BTA), a benzotriazole derivative and combinations thereof.

In some embodiments a method of manufacturing the composite copper foil can take the form of a process including the forming of a thin electrodeposited copper foil having a thickness of 1-6 µm, by providing a structural carrier layer; said carrier layer optionally comprising a thick copper foil, said thick copper foil having a drum side and a deposited side. The process further includes depositing on at least one of the drum side and deposited side of the thick copper foil a release layer, followed by electrodepositing a thin copper foil on the release layer, the thin electrodeposited copper foil having a thickness in the range of 1-6 µm, the thin electrodeposited copper foil having a shiny side adjacent the release layer and a deposited side remote from said release layer. One nodular layer may optionally be deposited on one of the sides selected from the group consisting of the deposited side, the side of the thick copper foil opposite the release layer and optionally on the deposited side of the thin electrodeposited copper foil can be formed, followed by forming the anti-tarnish layer and then organic anti-stick layer over the nodular layer on the deposited side of the thick copper foil to form a composite foil. Typically, the thin electrodeposited copper foil side is subsequently bonded to a polymeric film (dielectric material) by laminating. Lastly, the step of separating the thin electrodeposited copper foil from the release layer is performed.

While there are many modifications, and additional embodiments to those described above, the true scope of the disclosure will be appreciated in connection with the appended drawing and the detailed description below.

BRIEF DESCRIPTION OF THE DRAWINGS

Implementations of the present technology will now be described, by way of example only, with reference to the attached figures, wherein:

FIGS. 3A-3D is a schematic illustration of a method of making and a composite copper foil produced according to a third embodiment;

Figure 1A:
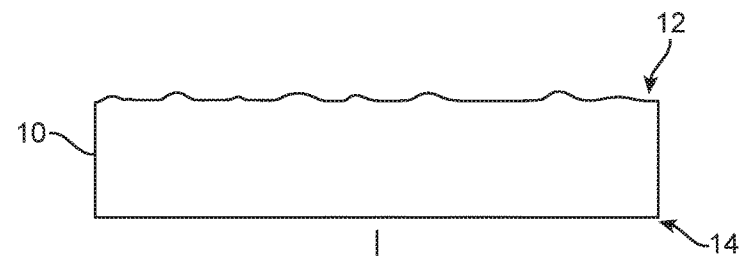
FIGS. 1A-1E is a schematic illustration of a method of making and a composite copper foil produced according to one embodiment.

It should be understood that the various aspects are not limited to the arrangements and instrumentality shown in the drawings.

DETAILED DESCRIPTION OF THE PREFERRED EMBODIMENTS (Throughout the drawings and the following description, identical elements contain the same numbering even though illustrated in different figures of the drawings).

FIGS. 1A-1E is a schematic illustration of the manufacture of a composite foil, and the resultant composite foil produced by the method of manufacture, according to a first embodiment. As shown in FIGS. 1A-1E, a carrier layer 10, which can be a thick metal foil on the order of 10-75 µm, preferably 10-35 µm, more preferably 10-30 µm is utilized as a carrier layer upon which a thin copper foil 18 is laminated, or alternatively can be formed in situ, such as by electrodeposited formation. The thick metal foil can be formed of any suitable metal, although copper is particularly preferred. The metal foil could be of determinate (finite) or indeterminate (infinite) length, or alternatively could be endless, such as a loop or belt.

According to a most particularly preferred embodiment, carrier layer 10 is a determinate or indeterminate length metal foil having a first side 12 and an opposed second side 14. When the metal of carrier layer 10 is copper, the copper can be provided in any suitable form, such as rolled copper layer, or as an electrodeposited copper layer. It is typical when electrolytically forming copper foil from a copper-containing electrolyte solution to use a rotating drum which contacts the electrolyte. Under the influence of an electric current, the drum will act as a cathode and the copper in the copper-containing solution will deposit on the surface of the drum. When the carrier layer 10 is provided as an electrolytically formed copper foil, it may be electrolytically formed having a drum side as the opposed second side 14 and a deposited side as the first side 12. The deposited side 12 is schematically represented as a wavy or non-planar surface due to the fact that the deposited side will typically have a surface roughness (Rz) which is larger than the drum formed opposed second side 14 of carrier layer 10. This is because, when the carrier layer 10 is an electrolytically formed copper foil, the drum formed side 14 will mimic the surface roughness of the cathode upon which the copper foil is deposited from a copper-containing electrolyte solution. The drum can be polished or otherwise formed to have a surface roughness indicative of the desired surface roughness (Rz) on the drum formed side 14 of carrier layer 10. On the other hand, the surface 12 of carrier layer 10, which is in contact with the electrolyte solution during formation of the electrodeposited carrier layer 10, will exhibit a surface roughness (Rz) which will vary from the surface roughness (Rz) of the drum formed side 14. It is possible to substitute other carrier layers, such as a rolled copper foil for the carrier layer 10, although such is a less preferred embodiment. It is also possible to provide a chromium release layer on one side of carrier layer 10 and then to attach a thin copper foil onto the chromium release layer provided on a side of carrier layer 10.

Figure 1B:
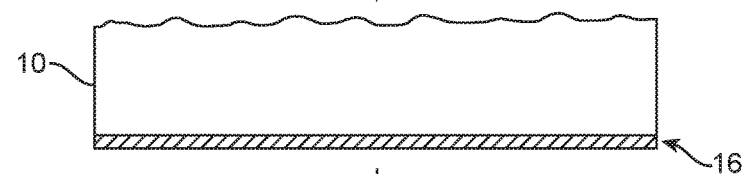

In the embodiment of FIG. 1B, a chromium release layer 16 is formed on one side 14 of carrier layer 10. This chromium release layer is preferably formed by electrodeposition on carrier layer 10 from a chromium-containing solution, such as chromic acid, to leave chromium release layer 16 on the drum formed side 14 of carrier layer 10. The formation of the chromium release layer 16 is preferably continuously formed as shown schematically in FIG. 4 upon carrier layer 10, and, although it is less desirable, but equally operative to batch-wise form the chromium release layer 16 on second side 14 of carrier layer 10. A chromium layer can also optionally be formed on the deposited side 12, either simultaneously with formation of chromium release layer 16, or sequentially (before or after) formation of chromium release layer 16. As it is an optional step in this embodiment, the chromium layer on the deposited side 12 is not illustrated in FIG. 1B through 1E.

Figure 1C:
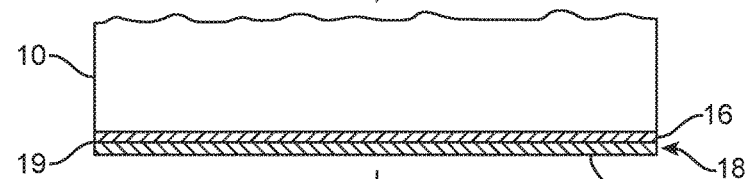
Figure 1D:
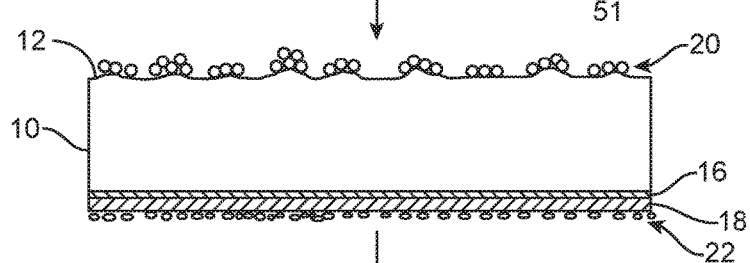

Following the formation of chromium release layer 16, a thin copper foil 18 is laminated, or alternatively formed in situ, by electrolytically depositing the thin copper foil 18 on chromium release layer 16 as shown in FIG. 1C. In either the embodiment of providing the thin copper foil as a laminae or alternatively forming the thin copper foil in situ by electrolytic deposition, the thin copper foil 18 will be of a thickness significantly smaller than the thickness of carrier layer 10. According to the preferred embodiments of the invention, thin copper foil 18 will not have a thickness greater than about 6 μm, preferably between about 1-6 μm, most preferably in the range of 2-5 μm, though it is to be understood that thin copper foil 18 could be less than 1 μm, an integer selected from 1 μm, 2 μm, 3 μm, 4 μm, 5 μm, 6 μm as minimum and maximum endpoints, or any range between these integers; or even thicker than 6 μm, without departing from the manufacturing method disclosed herein.

Figure 4:
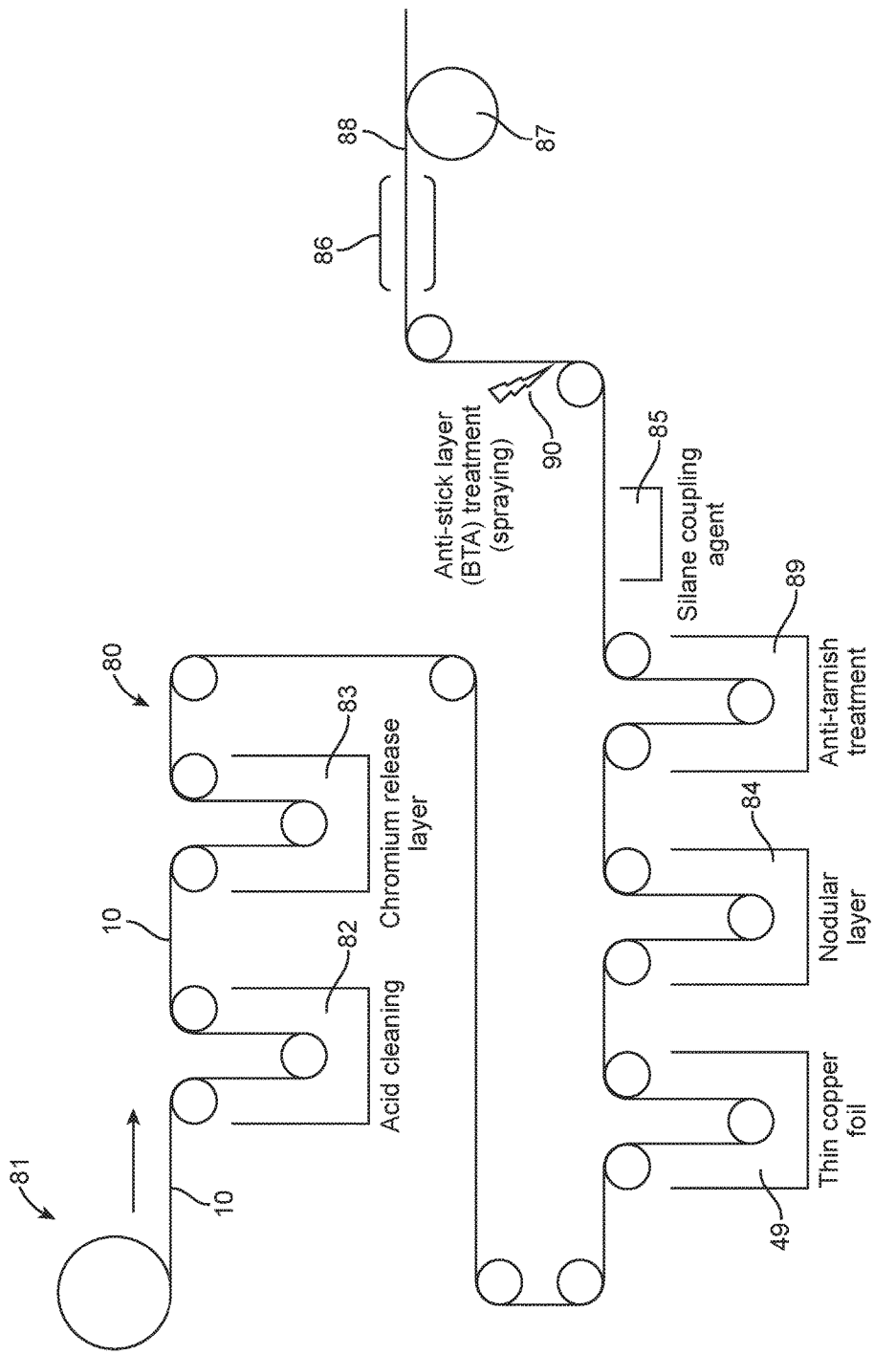
FIG. 4 is a schematic illustration of apparatus for forming a composite copper foil.

If electrolytically deposited, the thin copper foil 18 could have a shiny side 19 adjacent to the chromium release layer 16 and a deposited side 51 adjacent the copper containing electrolyte solution 49 in FIG. 4, which deposited side is the side of thin copper foil 18 is opposite shiny (or "S") side 19. In such a case, the carrier foil 10 and its chromium release layer 16 act as the cathode upon which the thin copper foil is electrolytically deposited. Thus the shiny side 19 of the thin copper foil 18 will be deposited on the chromium release layer and thus will mimic its surface characteristics while the electrolyte facing on deposited side 51 of the thin copper foil 18 will have a surface roughness determined by the components in the electrolyte bath. As noted above in connection with electrolytically depositing carrier layer 10, the components of the electrolyte bath can be manipulated to vary the surface roughness (Rz) of deposited side 51. It is to be expected that the shiny side 19 surface roughness (Rz) will typically be different than the surface roughness (Rz) of the deposited side 51, although the thin copper foil may be designed to have the same degree of surface roughness (Rz), or alternatively surface treated to have the same degree of surface roughness (Rz) and then, there will be no difference in surface roughness (Rz) between the shiny and deposited sides. When a pre-formed thin copper foil is to be laminated onto the composite foil, such thin copper foil can be manufactured in various ways, such as by rolling a billet or plate into a foil, or by providing a drum of thin copper foil which is unwound from the drum and laminated onto the carrier foil.

Next, a nodular layer 20 is optionally formed on the deposited side 12 of carrier layer 10. If present, these optional nodular layer is formed of nodules of copper created by passing the intermediate composite of FIG. 1C through a further copper containing solution 84 (FIG. 4) under electrolytic depositing conditions to deposit a layer of nodules 20 on the deposited side 12 of carrier layer 10 as in FIG. 1D. It is also within the scope of this embodiment (FIG. 1D) to deposit a layer of nodules 22 on the deposited side 51 of thin copper layer 18, although such is also an optional step.

Figure 1E:
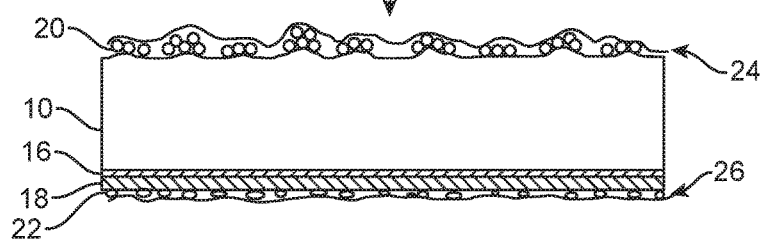

After formation of optional nodular layer 22 (and/or optional nodular layer 20), one, either, or both of the nodular layers 22, 20 can be coated with an organic coating as illustrated in FIG. 1E.

Figure 6:
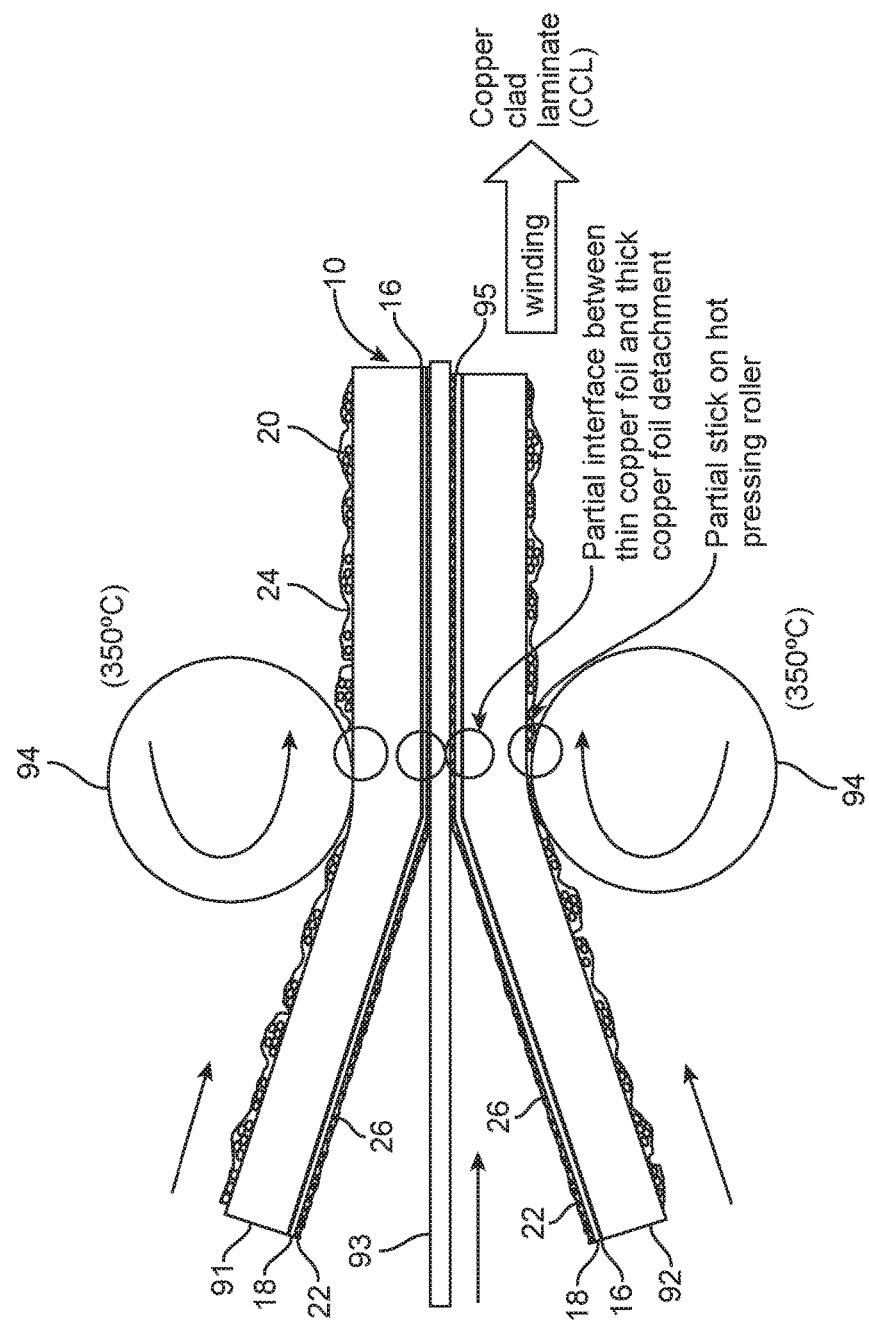

The organic coating layer 24 simultaneously performs both as an interface and as an anti-stick layer (protective layer) that will prevent copper nodular layer 20 (and its associated carrier layer 10) from discoloration and prevent sticking of its attached copper carrier layer 10 to a hot pressing roller (not shown in FIG. 1A-1E) shown in FIG. 6 which prevents copper carrier layer 10 to contact the hot pressing roller directly, which might create internal forces leading to deformation of the thin copper foil 18. It is preferred to use as the organic coating 24 a material comprising substituted triazoles, such as benzotriazole (BTA), a benzotriazole derivative and combinations thereof.

Benzotriazole has the formula (1):

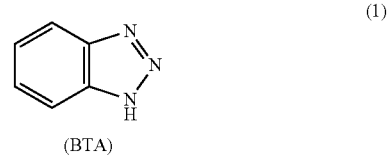

(BTA)

and when joined to copper reacts according to the following schema:

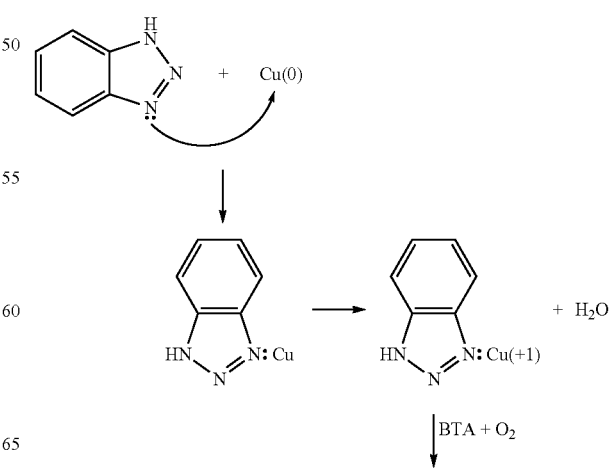

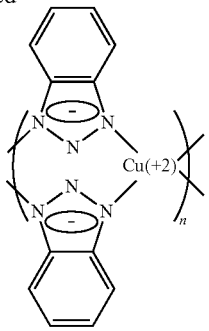

The use of substituted triazoles, its derivatives and combinations thereof is to protect the surface of carrier foil from corrosion, prevent the direct contact of a hot pressing roller in a roller press from contacting carrier layer 10 and acting as an anti-stick agent, to enhance the ability to peel the carrier copper foil layer 10 from the hot pressing roller. So the composite foil produced after pressing roller, is then separated from roller and separately recovered as on a take-up reel or the like without incompletely peeled off portions of the carrier foil 10 and causing unevenness on the surface of the carrier foil 10. Examples of substituted triazoles include 1,2,3-benzotriazole, carboxybenzotriazole, 1H-1,2,4-triazole, and aminotriazole, orthotriazole (1,2,3-tolyltriazole).

The substituted triazole content of the first organic layer over the second side of the carrier layer is preferable in the range of 0.1 to 6.5 μg/cm².

On the other hand, the organic coating 26 is one that will increase the adherence of the nodular layer 22 and its attached copper layer (thin copper foil 18) to a polymeric material (not shown in FIG. 1A-1E), but illustrated as polymeric film feed 93 in FIG. 6, which forms the body of a printed circuit board (PCB). It is often desirable to use silane coupling agent as the organic coating 26. A silane coupling agent, represented by the following formula: Y—R'—Si(OR)$_3$, wherein Y is selected from the group consisting of: glycidoxy(epoxy), amino, epoxycyclohexyl, uramino, carbamate, malonate, carboxy, cyano, acetoxy, acryloxy, methacryloxy, chloromethylphenyl, pyridyl, vinyl, dialkylamino, phenylalkylamino, and imidazole;

R' is ethylene, propylene, or phenylene substituted by ethyl or propyl wherein the phenyl ring is attached to Y, or a bond;

R is methyl, ethyl or other linear or branched C3-6alkyl.

The use of silane coupling agent is to increase the adherence to a polymeric printed circuit board material, such as the film feed 93 in FIG. 6.

Figure 2A:
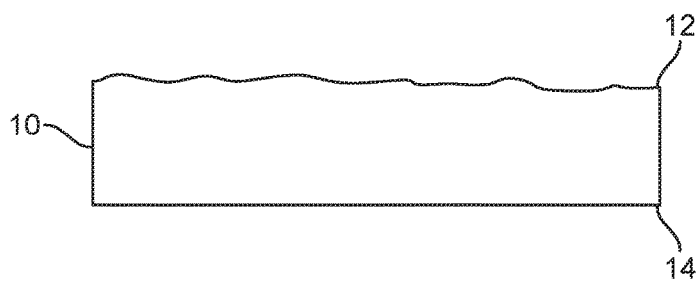
FIGS. 2A-2E is a schematic illustration of a method of making and a composite copper foil produced according to a second embodiment.

Turning now to FIGS. 2A-2E, which illustrates a second embodiment of the invention, FIG. 2A shows a schematic illustration of the manufacture of a composite foil, and the resultant composite foil produced by the method of manufacture, according to a second embodiment. As shown in FIGS. 2A-2E, a carrier layer 10, which can be a thick metal foil on the order of 10-75 μm, preferably 10-35 μm, more preferably 10-30 μm is utilized as a carrier layer upon which a thin copper foil 38 can be laminated, or alternatively, formed in situ, such as by electrolytic formation.

Carrier layer 10 has a first or deposited side 12 and a second opposed drum side 14 and a carrier layer 10 thickness on the order of 10-75 μm, preferably 10-35 μm, more preferably 10-30 μm and is formed of a metal, particularly a metal such as copper. According to a most particularly preferred embodiment, carrier layer 10 is an electrolytically formed copper layer having a drum formed side 14 and an electrolyte facing side 12. The deposited side 12 is schematically represented as a wavy or non-planar surface due to the fact that the electrolyte facing or deposited-side will typically have a surface roughness (Rz) which is larger than the drum formed side 14 of carrier 10. This is because, when the carrier 10 is an electrolytically formed copper foil, the drum side 14 will mimic the surface roughness of the cathode upon which the copper foil is deposited from a copper containing electrolyte solution. On the other hand, the surface 12 is in contact with the electrolyte solution during formation of the carrier layer 10 and will exhibit a surface roughness (Rz) which will vary from the surface roughness (Rz) of the drum side 14. It is also possible to substitute other carrier layers, such as a rolled copper foil having a first and a second opposed side, or other metal foil, for the carrier layer 10.

Figure 2B:
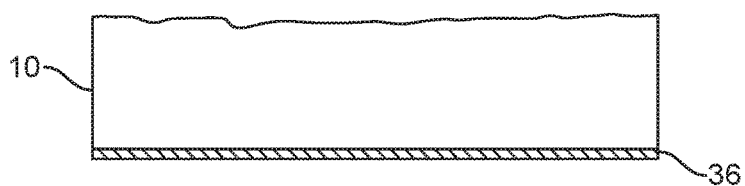
Figure 2C:
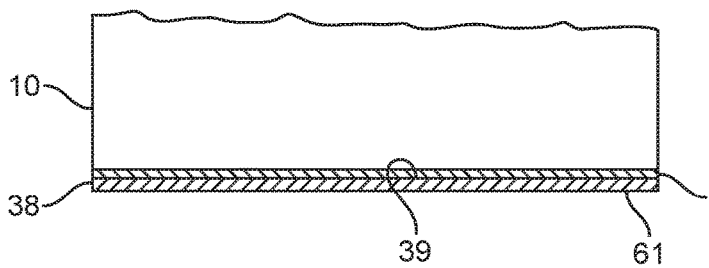

In the embodiment of FIG. 2B, a chromium release layer 36 is formed on only one side, e.g., the drum side 14 of carrier layer 10. This chromium release layer 36 is preferably formed by electrodeposition on carrier layer 10 from a chromium-containing solution, such as chromic acid, to leave chromium release layer 36 on side 14 of carrier layer 10. The formation of the chromium release layer 36 is preferably continuously formed as shown schematically in FIG. 4 upon carrier layer 10, although it is less desirable, but equally operative to batch-wise form the chromium release layer 36 on side 14 of carrier layer 10.

On deposited side 12, the provision of a chromium coating is optional and is omitted from this embodiment. Following the formation of chromium release layer 36, a thin copper foil 38 is laminated, but optionally formed in situ, by electrolytic deposition of the thin copper foil 38 on chromium release layer 36. Thin copper foil 38 will be of a thickness significantly smaller than the thickness of carrier layer 10. According to the preferred embodiments of the invention, thin copper foil 38 will not have a thickness greater than about 6 μm, preferably between about 1-6 μm, most preferably in the range of 2-5 μm, though it is to be understood that thin copper foil 38 could be less than 1 μm, an integer selected from 1 μm, 2 μm, 3 μm, 4 μm, 5 μm, 6 μm as minimum and maximum endpoints, or any range between these integers; or even thicker than 6 μm, without departing from the manufacturing method disclosed herein. Thin copper foil may have a shiny side 39 adjacent to the chromium release layer 36 and a deposited side 61 adjacent the copper containing electrolyte solution 49 in FIG. 4, which deposited side 61 is the side of thin copper foil 38 opposite shiny side 39. It is to be expected that the shiny side 39 surface roughness (Rz) will be different than the surface roughness (Rz) of the deposited side 61, although the thin copper foil 38 may be designed to have the same degree of surface roughness (Rz), or alternatively surface treated to have the same degree of surface roughness (Rz) as the shiny side and then, there will be no difference in surface roughness (Rz) between the shiny and deposited sides.

Next, an optional nodular layer 40 is formed on the deposited side 61 of thin copper foil 38. These nodules are formed of copper created by passing the intermediate composite of FIG. 2C through a further copper containing solution (FIG. 4) under electrolytic depositing conditions to deposit a layer of nodules 40 on the deposited side 61 of thin copper foil 38.

In this embodiment there is no deposit of a layer of nodules on the deposited side 12 of carrier layer 10.

Figure 2D:
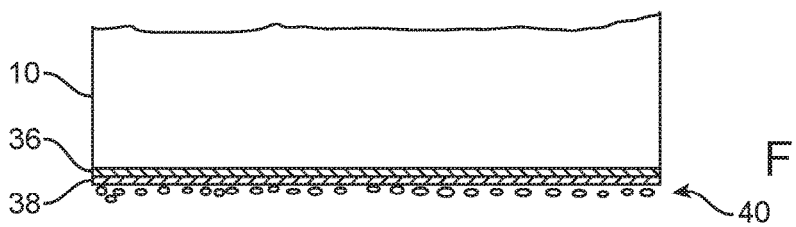
Figure 2E:
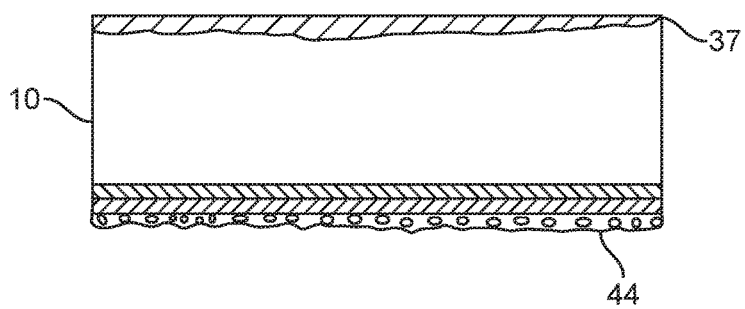

An organic coating 37 is formed on the deposited side 12 of carrier layer 10 as shown in FIG. 2E. This organic coating 37 can be a substituted triazole, its derivatives and combinations thereof has the same purpose as in the embodiment of FIGS. 1A-1E to protect the surface 12 from discoloration and as an anti-stick to prevent direct contact between a hot pressing roller and carrier layer 10. These properties are achieved even when the nodular layer (and optional chromium layer) of the embodiment of FIGS. 1A-1E are omitted After formation of nodular layer 40, the nodular layer 40 can be coated with an organic coating 44 illustrated in FIG. 2E. This organic coating 44 is one that will increase the adherence of the nodular layer 40 and its attached thin copper foil 38 to a polymeric material (not shown in FIGS. 2A-2E) which forms the body of a printed circuit board (PCB). It is preferred to use as the organic coating 44 a material such as a silane coupling agent.

The organic coating 44, applied directly to the nodules containing deposited side surface 61 of electrolytically deposited thin copper foil 38, is one that will increase the adherence of the copper layer (thin copper foil 38) to a polymeric material (not shown in FIG. 1A-1E), but illustrated as polymeric film feed 93 in FIG. 6, which forms the body of a printed circuit board (PCB). It is often desirable to use silane coupling agent as the organic coating 44, as in the embodiment illustrated in FIGS. 1A-1E. A silane coupling agent, or combinations thereof, wherein the silane coupling agent is represented by the following formula: Y—R'—Si(OR)$_3$, wherein Y is selected from the group consisting of: glycidoxy(epoxy), amino, epoxycyclohexyl, uramino, carbamate, malonate, carboxy, cyano, acetoxy, acryloxy, methacryloxy, chloromethylphenyl, pyridyl, vinyl, dialkylamino, phenylalkylamino, and imidazole;

R' is ethylene, propylene, or phenylene substituted by ethyl or propyl wherein the phenyl ring is attached to Y, or a bond;

R is methyl, ethyl or other linear or branched $C_3$-$C_6$ alkyl.

The use of silane coupling agent is to increase the adherence to a polymeric printed circuit board material, such as the film feed 93 in FIG. 6.

FIGS. 3A-3D illustrates a third embodiment of the invention, FIG. 3A shows a schematic illustration of the manufacture of a composite foil, and the resultant composite foil produced by the method of manufacture, according to a third embodiment. As shown in FIGS. 3A-3D, a carrier layer 10, which can be a thick copper foil on the order of 10-75 µm, preferably 10-30 µm is utilized as a carrier layer upon which a thin copper foil 48 can be electrolytically formed.

According to a most particularly preferred embodiment, carrier layer 10 is electrolytically formed having a drum side 14 and a deposited side 12. The deposited side 12 is schematically represented as a wavy or non-planar surface due to the fact that the deposited side will typically have a surface roughness (Rz) which is larger than the drum side 14 of carrier layer 10. This is because, when the carrier layer 10 is an electrolytically formed copper foil, the drum side 14 will mimic the surface roughness of the cathode upon which the copper foil is deposited from a copper containing electrolyte solution. On the other hand, the surface 12 is in contact with the electrolyte solution during formation of the carrier layer 10 and will exhibit a surface roughness (Rz) which will vary from the surface roughness (Rz) of the drum side 14. It is possible to substitute other carriers, such as a rolled copper foil for the carrier layer 10, although such is a less preferred embodiment.

In the embodiment of FIG. 3B, a chromium release layer 46 is formed on drum side 14 of carrier layer 10 and a chromium layer 47 is formed on deposited side 12 of carrier layer 10. These chromium release layer and chromium layer are preferably formed by electrodeposition on carrier layer 10 from a chromium-containing solution, such as chromic acid, to leave chromium release layer 46 on drum side 14 of carrier layer 10 and chromium layer 47 on deposited side 12 of carrier layer. The formation of the chromium release layers 46 and chromium layer 47 is preferably continuously formed as shown schematically in FIG. 4 upon carrier 10, although it is less desirable, but equally operative to batchwise form the chromium release layer 46 on drum side 14 of carrier layer 10. The chromium release layer 46 and chromium layer 47 can be formed sequentially or simultaneously, with simultaneous formation being preferable.

Following the formation of chromium release layer 46 and chromium layer 47 a thin copper foil 48 is electrolytically deposited on chromium release layer 46. Thin copper foil 48 will be of a thickness significantly smaller than the thickness of carrier layer 10. According to the preferred embodiments of the invention, thin copper foil 48 will not have a thickness greater than about 6 µm, preferably between about 1-6 µm, most preferably in the range of 2-5 µm, though it is to be understood that thin copper foil 48 could be less than 1 µm, an integer selected from 1 µm, 2 µm, 3 µm, 4 µm, 5 µm, 6 µm or any range between these integers; or even thicker than 6 µm, without departing from the manufacturing method disclosed herein.

Thin copper foil 48 will have a shiny side 57 adjacent to the chromium release layer 46 and a deposited side 71 adjacent the copper containing electrolyte solution 49 in FIG. 4, which deposited side 71 is the side of thin copper foil 48 opposite shiny side 57. It is to be expected that the shiny side 57 surface roughness (Rz) will be different than the surface roughness (Rz) of the deposited side 71, although the thin copper foil may be designed to have the same degree of surface roughness (Rz), or alternatively surface treated to have the same degree of surface roughness (Rz) and then, there will be no difference in surface roughness (Rz) between the shiny and deposited sides.

In this embodiment there is no deposit of a layer of nodules on the deposited side 12 of carrier layer 10 in contact with chromium layer 47 as there was in the embodiment of FIG. 2D. There is also no deposit of a layer of nodules on the deposited side 71 of thin copper foil 48.

After formation of thin copper foil 48, the thin copper foil 48 can be coated with an organic coating 54 illustrated in FIG. 3D This organic coating 54 is one that will increase the adherence of the thin copper foil 48 to a polymeric material (not shown in FIGS. 3A-3D) which forms the body of a printed circuit board (PCB). It is preferred to use as the organic coating 54 a material such as silane coupling agent and combinations thereof.

An additional organic coating material can be applied to chromium layer 47 as coating 59. Organic coating layer 59 can be a substituted triazole, its derivatives and combinations thereof has the same purpose as in the embodiment of FIGS. 1A-1E and 2A-2E to further protect the surface 12 from discoloration and as an anti-stick to prevent direct contact between a hot pressing roller and carrier layer 10. These properties are achieved even when the optional nodular layer of the embodiment of FIGS. 1A-1E are omitted.

Turning now to FIG. 4 is an apparatus 80 for performing the methods according to any of the embodiments of FIGS. 1A-1E, 2A-2E and/or 3A-3E. An endless carrier layer 10, having a first and a second opposed sides and a carrier layer thickness, may be unspooled from a source of the carrier layer, such as spool 81, which is preferably initially passed through a bath of a cleaning solution 82 to remove any contaminants, corrosion, protective coatings or layers from carrier layer 10. Once cleaned, carrier layer 10 passes through a bath 83 of a chromium containing compound, preferably containing chromic acid to deposit a chromium release layer on carrier layer 10. By the use of suitable electrodes (not shown in FIG. 4) the chromium release layer can be deposited on a second side 14 or on a first side 12 of carrier layer 10, or on both sides 12 and 14. After having the desired deposition of chromium release layer on carrier layer 10, carrier layer 10 containing the chromium release layer, are passed through a copper containing solution 49 to deposit a thin copper foil on the chromium release layer(s). The thin copper foil bearing carrier layer 10 is optionally then passed into a further copper containing solution 84 to form at least one layer of copper nodules. Again, by suitable arrangement of electrodes (not shown in FIG. 4) the layer(s) of copper nodules can be selectively electrolytically deposited on the carrier layer 10, the thin copper foil, or both, as desired in the final composite copper foil. After an anti-tarnish treatment 89, the nodule layer(s) are then coated by a triazole, preferably benzotriazole (BTA), a benzotriazole derivative and combinations thereof, to form a layer on the nodules by passing the nodule-containing layer(s) through spraying 90 which is a BTA, and/or BTA derivative containing solution. After passing through dryer 86, the composite copper foil can be wound onto coil 87, or alternatively, may be further processed.

The composite copper foil 88 can be laminated to additional components of a printed circuit board (PCB) such as polymeric components of the PCB and consolidated at elevated conditions of temperature and pressure. A schematic representation is shown in FIG. 6, where the arrows show the direction of movement. Suitable temperature conditions include elevated temperatures from 340-375° C., preferably 350° C. Elevated pressures as typically exerted by a hot pressing rollers 94, endless belt press or other continuous press apparatus can simultaneously apply the increased pressure with the elevated temperature. Two layers of composite copper foils 91, 92 are fed between the nip of the hot pressing rollers 94 together with a polymer component 93 of a printed circuit board. After leaving the nip of the hot pressing rollers 94, which is operated at elevated temperature of about 350° C., by heating the rollers with steam or electrically, the composite copper foils 91, 92 and polymer component 93 form a consolidated mass 95. A reciprocating cutter (not shown) can sever the consolidated mass 95 into discrete units for further processing.

In an alternative manner of consolidation, if the composite foils are fed to the nip of a roll press with the thin foil layers facing each other and positioned to come into contact with the polymer component of the printed circuit boards, the pressure exerted by the press will cause the thin copper foils to peel from the carrier layer at the chromium release layer and the carrier layers can be removed and recovered for reuse after the nip of the press as they would not have been in contact with the polymer component of the printed circuit board.

The pressure of the press apparatus will cause the thin copper foil to peel from the carrier providing a laminate where the thin copper foil is bonded directly to the polymeric component of the printed circuit board. Suitable polymeric components include epoxy based polymers, especially paper or glass fiber reinforced epoxy resins. Other suitable polymers include polyimides, polytetrafluoroethylene and other suitable polymers. A single copper layer is more correctly called a single-sided printed wiring board, but it is to be understood that single side, double sided and multiple layers of the thin copper foils, optionally suitable etched into patterns and joined with circuitry interconnections to form printed circuit boards (PCB) are capable of production with the disclosed embodiments of the invention. The assembly of the printed circuit boards from the components manufactured and disclosed herein is well within the skill of the art.

Figure 5:
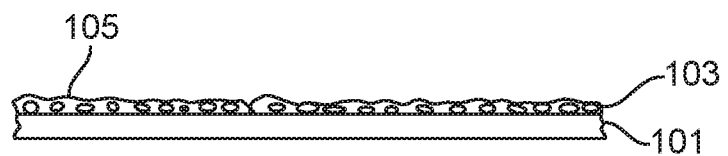
FIG. 5 is an enlarged schematic illustration of the separation of the thin electrodeposited copper foil from the composite copper foil according to the embodiment of FIG. 1; and, FIG. 6 is a schematic illustration of the formation of a flexible copper clad laminate (FCCL) utilizing the composite copper foil according to FIG. 1.

In an alternative to directly, continuously, laminating the composite foils, the thin copper foil can be peeled from the composite by passing the composite through a series of rollers to separate the thin copper foil layer from the composite copper foil at the chromium release layer interface. FIG. 5 schematically illustrates the thin copper foil 101 containing a nodular layer 103, upon which is deposited a silane coupling agent, and combinations thereof, as layer 105. Alternatively, the roll of composite foil 87 may be unwound and punched/cut into discrete panels to be further batch processed into PCBs.

The various embodiments will be further understood by reference to the following Examples. However, it should be expressly understood that the Examples are for exemplary purposes only and are not intended to limit the embodiments that may fall within the appended claims.

Example 1

An untreated electrodeposited copper foil of 18 μm in thickness was used for the carrier layer 10. At the beginning, the carrier layer 10 was directed into an acid washing/cleaning process. In the acid washing process, the inside of an acid washing vessel was filled with an electrolyte solution 82, which had 130 g/L copper sulfate and 50 g/L sulfuric acid, and the temperature of electrolyte solution was maintained at 27° C. The carrier layer was soaked into the electrolyte solution 82 for 30 seconds to remove the oil or fat and oxide on the surface and then the carrier layer was washed with water.

After the acid cleaning process, the carrier layer 10 was subjected to the chromium release layer formation on the drum side (surface roughness Rz<1.5 um). In the present example, the chromium release layer was formed by the electrolysis method. The chromium plating solution used was in the content of 10 g/L $CrO_3$; the electrolysis conditions were that the solution 83 temperature was 27° C., the current density was 2 $A/dm^2$ and the chromium release layer was formed with 40 $\mu g/dm^2$ of chromium. On completion of the chromium release layer formation, the carrier layer 10 was washed with water.

Next, the thin electrodeposited copper foil 18 formation process for formation of a 3 μm thin electrodeposited copper foil on the surface of chromium release layer 16, a copper sulfate solution 49 was used in which the concentrations of copper sulfate and sulfuric acid were 320 g/L and 100 g/L respectively and the current density was 15 $A/dm^2$. On completion of the formation of the 3 μm thin electrodeposited copper foil 18, in the copper nodular layer formation process, the copper nodular layers 22, 20 were formed by electroplating on the surface of the 3 μm thin electrodeposited copper foil 18 and the deposited side 12 of carrier layer 10 opposite the chromium release layer. For the formation of the copper nodular layers 22, 20 a copper sulfate solution 84 was used in which the concentration of copper sulfate and sulfuric acid were 70 g/L and 100 g/L respectively and the solution temperature was 25° C., and electrolysis was conducted for 10 seconds at a current density of 10 A/dm². Furthermore, a cover plating process was conducted for preventing the exfoliation of the copper nodular layers 22, 20. In the cover plating process, exactly the same copper sulfate solution 49 as that used in the above described formation of the 3 μm thin electrodeposited copper foil was used, and the electrolysis was conducted under smooth plating conditions. Then, on completion of the cover plating process, in the surface finishing process, the passivation (anti-tarnish) layer through an anti-tarnish treatment 89 was conducted and the side of the copper nodular layer 22 on the 3 μm thin electrodeposited copper foil was subjected to the silane coupling agent treatment 85. In the passivation process in the present example, Zinc was used as the passivating element, and not only the surface of nodular layer 22 on the 3 μm thin electrodeposited copper foil but also the surface of nodular layer 20 on the side of the carrier layer 10 opposite the chromium release layer 16 were simultaneously passivated. The zinc sulfate solution was used as the electrolyte in which the zinc sulfate concentration was maintained at 100 g/L, the pH of solution was 3.4, the solution temperature was set at 50° C., and the current density was set at 4 A/dm². On completion of the passivation, washing with water was conducted. Furthermore, for the purpose of rustproofing, the electrolytic chromium passivation was made over the Zinc passivation. Electrolytically, a chromium layer was formed on the Zinc passivation layer. The electrolysis conditions were as follows: chromic acid 5 g/L, pH 11.5, solution temperature 35° C., and current density 10 A/dm². This electrolytic chromium passivation was made not only on the Zinc passivated surface of copper nodular layer 22 on the 3 μm thin electrodeposited copper foil 18 but also simultaneously on the Zinc passivated surface of copper nodular layer 20 on the carrier layer opposite the chromium release layer 16.

On completion of the passivation treatment, washing with water, and immediately, without drying the copper foil surface, the adsorption of the silane coupling agent 26 was made only on the Zn/Cr passivated layer of copper nodular layer 22 of 3 μm thin electrodeposited copper foil 18, in a silane coupling agent treatment vessel 85. In this treatment, the concentration of solution was 0.25% 3-Aminopropyltriethoxysilane. The adsorption treatment may be performed by spraying the solution against the copper foil surface.

On completion of the silane coupling agent treatment, anti-stick layer 24 was performed only on the Zn/Cr passivated layer on the nodular layer 20 of carrier layer 10 opposite the chromate release layer 16. In this treatment, the concentration of solution was 0.002% BTA (1,2,3-benzotriazole).

The anti-stick layer treatment was performed by spraying the solution 90 against the copper foil surface. As the finally stage, the copper foil was made to pass through the heated furnace in which the temperature was set at 105° C., the copper foil was dehydrated and the condensation reaction of the silane coupling agent was promoted; then, the finished 3 μm thin electrodeposited copper foil 18 with carrier layer 10 was obtained.

The differences between Examples 1-4 and Comparative Example 1-3 was the BTA concentration of anti-stick treatment solution. Carboxybenzotriazole (CBT), which was one kind of derivative of BTA, was used in Example 5 and the concentration was 0.02%.

Thin electrodeposited copper foil with carrier layer (composite foil) which obtained from example 1~5 and comparative example 1~3 were slitting to roll type with 520 mm width. Two layers 91, 92 of thin electrodeposited copper foil with carrier layer were fed between the nip roll press together with a polyimide film 93. After leaving the nip of the roll press, which was operated at elevated temperature of about 350° C., the thin electrodeposited copper foil with carrier layer and polyimide film form a consolidated copper clad laminate. In the hot pressing process, the thin electrodeposited copper foil side faced with polyimide film, and carrier layer side contacted with hot pressing roller. The temperature of hot pressing rollers were very high about 350° C., if the anti-stick treatment (BTA treatment) on the carrier layer side surface was not enough, partial area of carrier layer will stick on the hot pressing roller when composite foil laminate with polyimide film. Then partial interface between thin electrodeposited copper foil and carrier layer will cause detachment after composite foil goes through the hot pressing roller and will cause bubble (blister) defect. In hot pressing process, the separation condition between carrier layer of composite foil and hot pressing roller was observed. And after formation of a consolidated copper clad laminate, 520 mm*520 mm sample was taken to see if there were any bubbles (partial interface between thin copper foil 18 and carrier layer detachment) on the carrier layer side 10.

| | BTA or derivative concentration of anti-stick treatment solution (%) | The separation condition between carrier layer of composite foil and hot pressing roller after hot pressing | If there has bubble or blister (partial interface between thin electro-deposited copper foil and carrier layer detachment) on the carrier layer side after hot pressing | BTA or its derivative content on the surface of carrier layer side (μg/cm²) |
|---|---|---|---|---|
| Example 1 | 0.002 | Separate evenness | No | 0.120 |
| Example 2 | 0.01 | Separate evenness | No | 0.657 |
| Example 3 | 0.05 | Separate evenness | No | 3.265 |
| Example 4 | 0.1 | Separate evenness | No | 6.491 |
| Example 5 | 0.02 | Separate evenness | No | 1.764 |
| Comparative example 1 | 0 | Separate unevenness | Yes | 0 |
| Comparative example 2 | 0.001 | Separate unevenness | Yes | 0.065 |
| Comparative example 3 | 0.5 | Separate evenness, but hot pressing roller was easy contaminated because of too high BTA concentration. | No | 32.843 |
| | BTA or derivative concentration of anti-stick treatment solution (%) | The separation condition between carrier layer of composite foil and hot pressing roller after hot pressing | If there has bubble or blister (partial interface between thin electro-deposited copper foil and carrier layer detachment) on the carrier layer side after hot pressing | BTA or its derivative content on the surface of carrier layer side (μg/cm²) |

The measure method of BTA or its derivative content on the surface of carrier layer side.

1. The thin copper foil side of composite foil was coated with protective resin layer.
2. Composite foil sample was cut by the size 10 cm×10 cm.

3. Composite foil sample was immersed in 50 ml 0.2 N $H_2SO_4$ solution for 30 mins to dissolve the BTA or its derivative on the carrier layer surface and then the solution with BTA or its derivative was diluted to 250 ml with DI water.

4. HPLC instrument was used to measure the content of BTA or its derivative in the solution and then transfer to the unit by ug/cm$^2$. The measure conditions of HPLC as follow:
  a. Pump: waters 515
  b. Detector: waters 2996 (PDA), 254 nm
  c. Column: Luna, C18, 100 A, 4.6*250 mm
  d. Mobile phase: 70% (A) 0.2% formic acid in water, 30% (B) ACN;
  e. Flow rate: 1 mL/min
  f. Injection volume: 50 uL It will be apparent to those skilled in the art upon reading the disclosure of the several embodiments, including preferred embodiments and Examples, that such embodiments and Examples are non-limiting and that many modifications, variations and equivalents will be evident to those or ordinary skill in the art to which this disclosure is directed, without departing from the spirit or scope of the appended claims.

We claim:

1. A composite foil comprising:
  a structural carrier layer; the structural carrier layer comprising a metal foil, said metal foil having opposed first and second sides, the structural carrier layer having a carrier layer thickness;
  a release layer having first and second opposed sides and a release layer thickness less than the carrier layer thickness, the composite foil having only one release layer;
  a thin electrodeposited copper foil having first and second sides and an electrodeposited copper foil thickness less than the carrier layer thickness, the structural carrier layer first side in contact with the release layer first side,
  the release layer second side in contact with the thin electrodeposited copper foil first side,
  a first nodular layer having opposed first and second sides is present or absent,
  an anti-tarnish layer is present or absent,
  a first organic layer comprising at least one anti-stick compound; the first organic layer being an outermost layer on only one side of the composite foil;
  wherein if the anti-tarnish layer and first nodular layer are each absent, the first organic layer is in direct contact with the structural carrier layer second side; wherein if the first nodular layer is absent but the anti-tarnish layer is present on the second side of the structural carrier layer, the first organic layer is in direct contact with the anti-tarnish layer on the second side of the structural carrier layer; wherein if the first nodular layer is present, the first nodular layer first side is in direct contact with the structural carrier layer second side and the first nodular layer second side is in direct contact with the first organic layer; wherein if the first nodular layer and the anti-tarnish layer are each present, the first nodular layer is in direct contact with the second side of the structural carrier layer and the anti-tarnish layer is in direct contact with the first nodular layer and the first organic layer is in direct contact with the anti-tarnish layer; with the proviso that the first organic layer is present in an amount in the range of 1.764 to 6.5 μg/cm$^2$;
  a second nodular layer is present or absent, wherein if the second nodular layer is present, the second nodular layer contacts the thin electrodeposited copper layer second side.

2. The composite foil of claim 1, wherein the composite foil comprises at least one of the first nodular layer and the second nodular layer.

3. The composite foil of claim 1, wherein the composite foil comprises the first nodular layer and the second nodular layer.

4. The composite foil of claim 1, wherein the structural carrier layer metal foil is an electrolytically deposited copper foil having a drum side and a deposited side, the drum side being the structural carrier layer first side and the deposited side being the structural carrier layer second side;
  at least the drum side of the structural carrier layer copper foil is in contact with the release layer;
  the release layer is in direct contact with the thin electrodeposited copper foil, the thin electrodeposited copper foil having a deposited side, and a shiny side, the shiny side being the thin electrodeposited copper foil first side adjacent the release layer;
  at least one of the first nodular layer and the second nodular layer is present.

5. The composite foil of claim 1, wherein the first organic layer is one selected from the group consisting of a substituted triazole, benzotriazole (BTA), a benzotriazole derivative and combinations thereof.

6. The composite foil of claim 1, wherein the first organic layer is a substituted triazole.

7. The composite foil of claim 1, wherein the release layer is a chromium release layer.

8. The composite foil of claim 1, further comprising a second organic layer for promoting adhesion of the thin electrodeposited copper foil to an organic substrate; a second nodular layer is present or absent, wherein the second organic layer has a composition different from the first organic layer,
  wherein if the second nodular layer is absent, the second organic layer directly contacts the thin electrodeposited copper foil; wherein if the second nodular layer is present, the second nodular layer has first and second opposed sides, the second nodular layer first side contacts the thin electrodeposited copper foil second side and the second nodular layer second side directly contacts the second organic layer.

9. The composite foil of claim 8, wherein the second organic layer comprises a silane coupling agent.

10. The composite foil of claim 9, wherein the silane coupling agent is represented by the following formula: Y—R'—Si(OR)$_3$,
  wherein Y is selected from the group consisting of: glycidoxy(epoxy), amino, epoxycyclohexyl, uramino, carbamate, malonate, carboxy, cyano, acetoxy, acryloxy, methacryloxy, chloromethylphenyl, pyridyl, vinyl, dialkylamino, phenylalkylamino, and imidazole;
  R' is ethylene, propylene, or phenylene substituted by ethyl or propyl wherein the phenyl ring is attached to Y, or a bond;
  R is methyl, ethyl or other linear or branched C3-C6 alkyl.

11. The composite foil of claim 8, wherein the second nodular layer is present, the second nodular layer has first and second opposed sides, the second nodular layer first side contacts the thin electrodeposited copper foil layer second side and the second nodular layer second side further contacts an anti-tarnish layer, and the second organic layer directly contacts the anti-tarnish layer in contact with the second nodular layer second side.

12. The composite foil of claim 1, wherein the structural carrier layer metal foil has a thickness in the range of 10-30 µm.

13. The composite foil of claim 1, wherein the thin electrodeposited copper foil has a thickness in the range of 1-6 µm.

14. The composite foil of claim 1, wherein the thin electrodeposited copper foil has a thickness in the range of 2-5 µm.

15. The composite foil of claim 1, wherein the structural carrier layer is of indeterminate length.

16. The composite foil of claim 1, wherein the structural carrier layer is an electro-deposited copper structural carrier layer having a first side which is the drum side and a second side which is the deposited side.

17. A printed circuit board (PCB) comprising the composite foil of claim 1.

* * * * *